United States Patent
Mori et al.

(10) Patent No.: US 8,187,507 B2
(45) Date of Patent: May 29, 2012

(54) GAN CRYSTAL PRODUCING METHOD, GAN CRYSTAL, GAN CRYSTAL SUBSTRATE, SEMICONDUCTOR DEVICE AND GAN CRYSTAL PRODUCING APPARATUS

(75) Inventors: Yusuke Mori, Suita (JP); Takatomo Sasaki, Suita (JP); Fumio Kawamura, Suita (JP); Masashi Yoshimura, Suita (JP); Minoru Kawahara, Suita (JP); Yasuo Kitaoka, Suita (JP); Masanori Morishita, Suita (JP)

(73) Assignee: Osaka University, Osaka (JP)

( * ) Notice: Subject to any disclaimer, the term of this patent is extended or adjusted under 35 U.S.C. 154(b) by 107 days.

(21) Appl. No.: 12/514,836

(22) PCT Filed: Nov. 14, 2007

(86) PCT No.: PCT/JP2007/072135
§ 371 (c)(1),
(2), (4) Date: Jun. 2, 2009

(87) PCT Pub. No.: WO2008/059901
PCT Pub. Date: May 22, 2008

(65) Prior Publication Data
US 2010/0059717 A1     Mar. 11, 2010

(30) Foreign Application Priority Data
Nov. 14, 2006   (JP) .................................. 2006-308170

(51) Int. Cl.
*H01B 1/06*  (2006.01)
*C01G 15/00* (2006.01)
(52) U.S. Cl. ................ 252/521.6; 252/506; 252/519.14; 252/521.5; 252/301.4 R; 423/137; 423/111
(58) Field of Classification Search ............... 252/521.6, 252/506, 519.14, 521.5, 301.4 R; 423/137, 423/111
See application file for complete search history.

(56) References Cited

U.S. PATENT DOCUMENTS

| | | | |
|---|---|---|---|
| 2003/0164138 A1 | 9/2003 | Sarayama et al. | |
| 2004/0105481 A1* | 6/2004 | Ishida et al. | 372/108 |
| 2004/0183090 A1* | 9/2004 | Kitaoka et al. | 257/103 |
| 2004/0262630 A1* | 12/2004 | Kitaoka et al. | 257/189 |
| 2005/0040385 A1 | 2/2005 | Craven et al. | |
| 2005/0082564 A1* | 4/2005 | Kitaoka et al. | 257/103 |
| 2006/0008941 A1* | 1/2006 | Haskell et al. | 438/93 |
| 2006/0051942 A1 | 3/2006 | Sasaki et al. | |
| 2006/0169197 A1 | 8/2006 | Sasaki et al. | |
| 2006/0228819 A1 | 10/2006 | Oshima | |
| 2010/0078606 A1* | 4/2010 | Yamada et al. | 252/521.5 |
| 2011/0012070 A2* | 1/2011 | Yamada et al. | 252/521.5 |

FOREIGN PATENT DOCUMENTS

| | | |
|---|---|---|
| JP | 2000-327495 | 11/2000 |
| JP | 2001-102316 | 4/2001 |
| JP | 2003-292400 | 10/2003 |
| JP | 2006-514780 | 5/2006 |
| JP | 2006-290677 | 10/2006 |
| JP | 2007-182333 | 7/2007 |
| WO | 2004/013385 | 2/2004 |
| WO | 2004/083498 | 9/2004 |

OTHER PUBLICATIONS

Kawamura et al., "Synthesis of Bulk GaN Single Crystals Using Na-Ca Flux," Japanese Journal of Applied Physics, vol. 43, No. 12B, pp. L1440-L1442, 2002.
Aoki et al., "Influence of 3d-Transition-Metal Additives on Single Crystal Growth of GaN by the Na Flux Method," Japanese Journal of Applied Physics, vol. 42, No. 9A, pp. 5445-5449, 2003.
Grazegory, et al., "III-V Nitrides-thermodynamics and crystal growth at high $N_2$ pressure", Journal of Physics and Chemistry of Solids, vol. 56, Issues 3-4, Mar.-Apr. 1995, pp. 639-647 (Abstract only).
Kawamura, et al., "Growth of Transparent Large Size GaN Single Crystal with Low Dislocations Using Alkali Metal-based Flux", Journal of the Japanese Association for Crystal Growth, vol. 30, No. 2, 2003, pp. 38-45 (with an English abstract).
Kawamura, et al., "Novel Liquid Phase Epitaxy (LPE) Growth Method for Growing Large GaN Single Crystals: Introduction the Flux Film Coated-Liquid Phase Epitaxy (FFC-LPE) Method", Japanese Journal of Applied Physics, vol. 42, part 2, No. 8A, 2003, pp. L879-L881 (Abstract only).
Tanpo, et al., "The Effect of Additive of Carbon into Na flux on the Growth of GaN Single Crystals", Abstract of the $54^{th}$ Lecture Meeting of Applied Physics Association, vol. 54, No. 1, 2007, p. 378.
Morishita, et al., "Growth of Thick GaN Substrates with Diameter of 2 Inch using C added Na Flux", Abstract of the $54^{th}$ Lecture Meeting of Applied Physics Association, vol. 54, No. 1, 2007, p. 379.
Japanese Office Action issued in Japanese Application No. 2008-544184, mailed Feb. 15, 2010, 5 pages—with a partial English translation.

\* cited by examiner

*Primary Examiner* — Douglas Mc Ginty
(74) *Attorney, Agent, or Firm* — Hamre, Schumann, Mueller & Larson, P.C.

(57) ABSTRACT

A method for producing a GaN crystal capable of achieving at least one of the prevention of nucleation and the growth of a high-quality non-polar surface is provided. The production method of the present invention is a method for producing a GaN crystal in a melt containing at least an alkali metal and gallium, including an adjustment step of adjusting the carbon content of the melt, and a reaction step of causing the gallium and nitrogen to react with each other. According to the production method of the present invention, nucleation can be prevented, and as shown in FIG. 4, a non-polar surface can be grown.

12 Claims, 7 Drawing Sheets

FIG. 13

GAN CRYSTAL PRODUCING METHOD, GAN CRYSTAL, GAN CRYSTAL SUBSTRATE, SEMICONDUCTOR DEVICE AND GAN CRYSTAL PRODUCING APPARATUS

TECHNICAL FIELD

The present invention relates to a GaN crystal producing method, a GaN crystal, a GaN crystal substrate, a semiconductor device and a GaN crystal producing apparatus.

BACKGROUND ART

Group III nitride crystal, which is a semiconductor, is used in the field of, for example, heterojunction high-speed electronic and photoelectronic devices (a semiconductor laser, a light emitting diode (LED), a sensor, etc.). Gallium nitride (GaN) crystals have attracted particular attention. Conventionally, a single crystal of gallium nitride has been produced by causing gallium and nitrogen gas to react directly with each other (see Non-Patent Document 1). However, this reaction requires ultra-high temperature and pressure conditions, i.e., 1300 to 1600° C. and 8000 to 17000 atm (about 800 to 1700 MPa). To solve this problem, a technique of growing a gallium nitride single crystal in a sodium (Na) flux (melt) (hereinafter also referred to as a "Na flux method") has been developed (see, for example, Patent Documents 1 to 3 and Non-Patent Documents 2 and 3). By this method, the heating temperature can be reduced significantly to 600 to 800° C., and the pressure can be reduced to as low as about 50 atm (about 5 MPa). In the Na flux method, a seed crystal is placed in the Na flux beforehand so that a crystal is grown from the seed crystal as a nucleus. A bulk crystal can be obtained by this method. When a single GaN crystal is grown, the seed crystal is, for example, a multilayer substrate in which a thin GaN crystal film layer is formed on a sapphire substrate using MOCVD or HVPE. Such a technique is also referred to as "liquid phase epitaxy."

The application of light emitting diodes (LED), which are electronic devices made of single GaN crystals, to lighting has been expected and, therefore, has been studied and developed actively. This is because an LED made of a single GaN crystal can save significant power as compared to conventional lighting devices, such as fluorescent lamps and the like. However, there is a limitation on improvement of the luminance of a conventional GaN single-crystal LED and, therefore, a high luminance, which theoretically is predicted, has not been achieved. This is because there are the following three problems:

(1) the non-uniform distribution of charge in the LED;
(2) a change in the wavelength of emitted light due to an increase in luminance; and
(3) the presence of a high-resistance portion of the LED.

Figure 1:
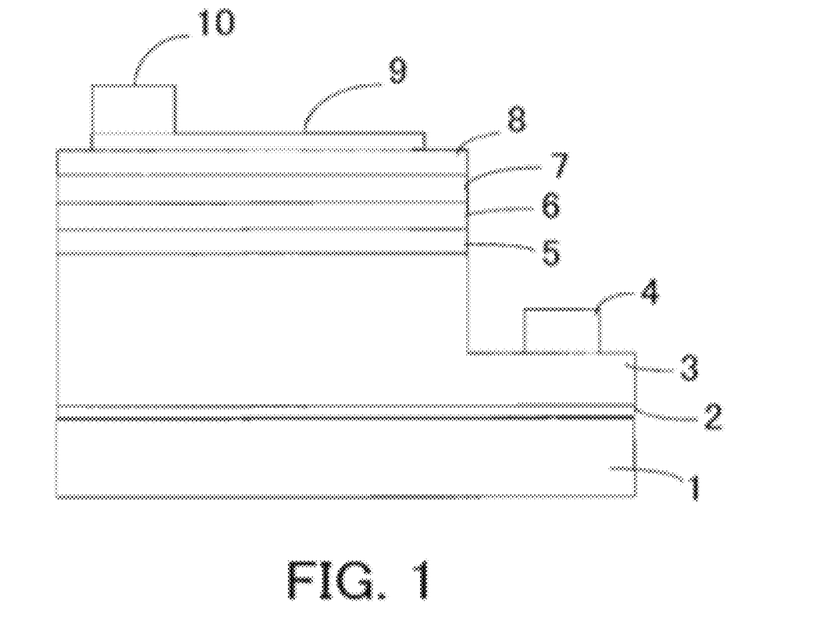
FIG. 1 is a diagram showing the structure of an exemplary semiconductor device.

The three problems (1) to (3) can be solved theoretically by fabricating an LED on a non-polar surface of a GaN crystal substrate. Non-polar surface refers to a surface on which charge is uniformly distributed. However, in the conventional art, it is not possible to fabricate an LED on the non-polar surface of a GaN crystal substrate. FIG. 1 shows a basic structure of an LED. As shown in FIG. 1, the LED includes a low-temperature buffer layer 2, a GaN crystal (Si-doped) layer 3, an n-AlGaN (Si-doped) layer 5, an InGaN layer 6, a p-AlGaN (Mg-doped) layer 7, a p-GaN (Mg-doped) layer 8, a transparent electrode layer 9, and a p-layer electrode 10, which are laminated in this stated order on a substrate 1 made of sapphire or silicon carbide. In addition, an n-layer electrode 4 is provided on a portion of the GaN crystal (Si-doped) layer 3. In the fabrication of a conventional LED, as show in FIG. 2, the GaN crystal layer 3 is grown on the substrate 1 made of sapphire or the like by liquid phase epitaxy with the low-temperature buffer layer 2 being interposed therebetween. The GaN crystal is grown only on its c-plane. Although a side surface 32 of the GaN crystal layer 3 is an M-plane, an upper surface 31 of the GaN crystal layer 3 is a c-plane. If a non-polar surface, such as an M-plane or the like, is forcibly formed, the resultant crystal is of poor quality, so that the luminance cannot be improved.

Figure 8:
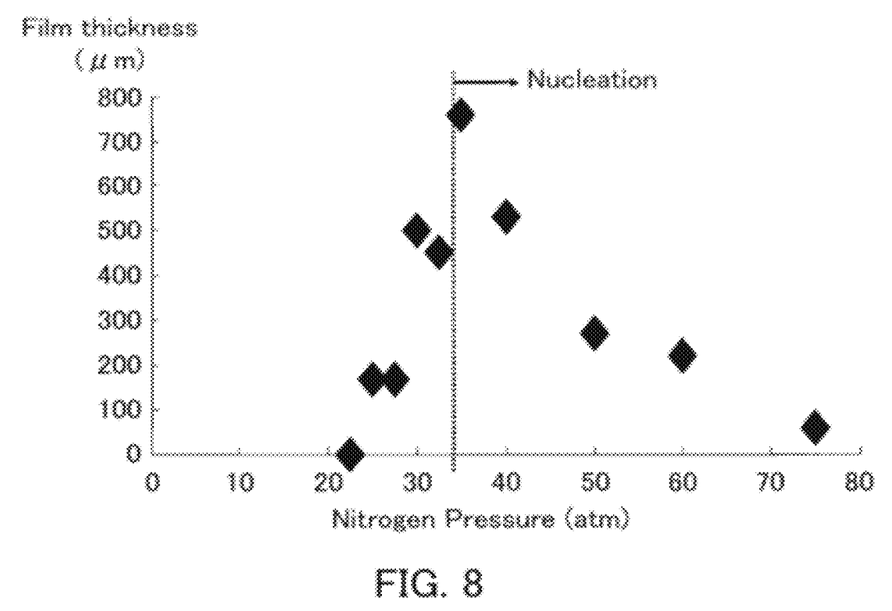
FIG. 8 is a graph showing an example of the relationship between the pressure of nitrogen gas and the thickness (film thickness) of a GaN crystal.

Moreover, in liquid phase epitaxy using Na flux (melt), nuclei other than the seed crystal occur in the flux, which leads to a deterioration in the quality and yield of a GaN crystal. FIG. 8 shows a graph indicating an exemplary relationship between the pressure of nitrogen gas and the thickness (film thickness) of a GaN crystal formed on a substrate. As shown in FIG. 8, as the nitrogen gas pressure is increased, the GaN crystal thickness also increases. When the nitrogen gas pressure exceeds some point (in FIG. 8, about 34 atm), the GaN crystal thickness conversely decreases. This is because, as shown in FIG. 8, nuclei other than the seed crystal occur in the Na flux.

The non-polar surface growth problem and the nucleation problem should be solved not only for the production of a GaN crystal, but also for the production of other group III nitride crystals.

Patent Document 1: JP 2000-327495 A
Patent Document 2: JP 2001-102316 A
Patent Document 3: JP 2003-292400 A
Non-Patent Document 1: J. Phys. Chem. Solids, 1995, 56, 639
Non-Patent Document 2: Journal of the Japanese Association for Crystal Growth, 30, 2, pp 38-45 (2003)
Non-Patent Document 3: J. J. Appl. Phys. 42, pp L879-L881 (2003)

DISCLOSURE OF INVENTION

Therefore, an object of the present invention is to provide a GaN crystal producing method, a GaN crystal, a GaN crystal substrate, a semiconductor device and a GaN crystal producing apparatus that can achieve at least one of the prevention of nucleation and the growth of a high-crystallinity non-polar surface.

To achieve the object, the production method of the present invention is a method for producing a GaN crystal in a melt containing at least an alkali metal and gallium (Ga), including:

an adjustment step of adjusting a carbon content of the melt; and a reaction step of causing the gallium (Ga) and nitrogen to react with each other.

The GaN crystal of the present invention is a GaN crystal that has a non-polar surface as a major surface thereof, a full width at half maximum of a rocking curve of double-crystal X-ray diffraction within a range of more than 0 seconds to 200 seconds or less, and a dislocation density within a range of more than $0/cm^2$ and $10^6/cm^2$ or less.

The GaN crystal substrate of the present invention includes the GaN crystal of the present invention. The non-polar surface is a substrate surface on which a semiconductor layer is to be provided.

The semiconductor device of the present invention includes the substrate of the present invention. A semiconductor layer is provided on the substrate surface.

The GaN crystal producing apparatus of the present invention is an apparatus for producing a GaN crystal in a melt containing at least an alkali metal and gallium, including:

an adjustment unit for adjusting a carbon content of the melt; and a reaction unit for causing the gallium and nitrogen to react with each other.

Extensive research has been carried out by the present inventors so as to achieve the object. As a result, the present inventors have found that at least one of the prevention of nucleation in the melt and the growth of a high-quality non-polar surface can be achieved by adjusting the carbon content of the melt containing an alkali metal (e.g., carbon is added into the melt), thereby achieving the present invention. As described above, the GaN crystal of the present invention has a non-polar surface as its major surface, a full width at half maximum of a rocking curve within a predetermined range, and a dislocation density within a predetermined range. This GaN crystal has higher crystallinity quality than that produced by a conventional technique, such as a vapor phase method or the like. The GaN crystal of the present invention having such high quality can be produced by the production method of the present invention. The production method is not limited to this. Note that the term "major surface" refers to the largest surface of a crystal.

BEST MODE FOR CARRYING OUT THE INVENTION

In the production method of the present invention, the adjustment step preferably includes at least one of a removal step of removing a portion of carbon in the melt and an addition step of adding carbon into the melt.

The production method of the present invention preferably includes a seed crystal providing step of providing a seed crystal in the melt. The seed crystal is preferably a GaN crystal.

In the production method of the present invention, the form of the carbon is not particularly limited. The carbon is either carbon or a carbon compound.

In the production method of the present invention, the seed crystal is preferably a GaN crystal layer provided on a substrate.

In the production method of the present invention, a crystal nucleus other than the seed crystal preferably is prevented from forming by adjusting the carbon content of the melt (e.g., by adding carbon to the melt). In this case, the carbon content of the melt is within a range of, for example, 0.1 to 5 atoms % with respect to the total of the melt, the gallium and the carbon.

In the production method of the present invention, a non-polar surface of the GaN crystal preferably is grown by adjusting the carbon content of the melt (e.g., by adding carbon to the melt). In this case, the carbon content of the melt is within a range of, for example, 0.3 to 8 atoms % with respect to the total of the melt, the gallium and the carbon. Note that, in the production method of the present invention, a surface other than a non-polar surface may be grown and, thereafter, this surface may be cut to expose a non-polar surface.

In the production method of the present invention, the seed crystal is preferably a GaN crystal layer on a substrate. In this case, at least one of an M-plane and an a-plane is preferably grown by adjusting the carbon content of the melt (e.g., by adding carbon into the melt). Moreover, in this case, an upper surface of the GaN crystal layer on the substrate is preferably a non-polar surface (at least one of an a-plane and an M-plane). Note that the production method of the present invention is not limited to this. A plane other than an M-plane, an a-plane and a c-plane may be grown. Specifically, in the production method of the present invention, when a GaN crystal is grown, a plane that has angles with respect to an M-plane and an a-plane that are smaller than an angle with respect to a c-plane, is grown, and the grown surface is cut to expose an M-plane or an a-plane.

In the production method of the present invention, the melt preferably contains Na, for example.

The production method of the present invention may further include an agitation step of agitating the melt. The timing of performing the agitation step is not particularly limited. For example, the agitation step may be performed at one or more of: before the reaction step; at the same time as the reaction step is performed; and after the reaction step. More specifically, for example, the agitation step may be performed before the reaction step and/or at the same time as the reaction step is performed.

The GaN crystal of the present invention may contain carbon. The GaN crystal of the present invention preferably is produced by the production method of the present invention.

The semiconductor device of the present invention is preferably, for example, an LED, a semiconductor laser or a high-frequency power electronic device.

Next, the present invention will be described in detail.

As described above, the production method of the present invention is a method for producing a GaN crystal in a melt containing at least an alkali metal and gallium. The method includes an adjustment step of adjusting the carbon content of the melt, and a reaction step of causing the gallium and nitrogen to react with each other. The adjustment step may include at least one of a removal step of removing a portion of the carbon in the melt and an addition step of adding carbon into the melt.

The method may further include a seed crystal providing step of providing a seed crystal containing a group III nitride in the melt.

For example, the production method of the present invention is a GaN crystal producing method for growing a GaN crystal by causing gallium and nitrogen to react with each other in a melt containing an alkali metal, where a seed crystal of GaN previously placed in the melt functions as a crystal nucleus. In this method, the melt contains carbon. The present invention also relates to a method for controlling a growth surface of the GaN crystal and/or a method for preventing nucleation from occurring in the melt, which are achieved by carbon being contained in the melt, in the GaN crystal producing method of the present invention.

The alkali metal in the melt functions as a flux in liquid phase epitaxy. Examples of the alkali metal include lithium (Li), sodium (Na), potassium (K), rubidium (Rb), cesium (Cs) and francium (Fr). Among them, Li and Na are preferable, and Na is more preferable. The melt may contain other components including, for example, gallium (Ga) and nitrogen (N) as materials for the GaN crystal, a material for the flux other than the alkali metal, and the like. The nitrogen may be, but is not limited to being, in the form of a gas, a nitrogen molecule, a nitrogen compound or the like. Examples of the flux material include alkaline-earth metals, specifically, calcium (Ca), magnesium (Mg), strontium (Sr), barium (Br) and radium (Ra). Among them, Ca and Mg are preferable, and Ca is more preferable. The proportion of the added alkali metal to gallium is, for example, 0.1 to 99.9 mol %, preferably 1 to 99 mol %, and more preferably 5 to 98 mol %. The molar ratio of an alkali metal and an alkaline-earth metal when a mixed flux thereof is used is, for example, the alkali metal:the alkaline-earth metal=99.99 to 0.01:0.01 to 99.99, preferably 99.9 to 0.05:0.1 to 99.95, and more preferably 99.5 to 1:0.5 to 99. The purity of the melt is preferably high. For example, the purity of Na is preferably 99.95% or more. A high-purity flux component (e.g., Na) may be commercially available. Alternatively, a commercially available product may be purchased, and then distilled or the like to increase the purity of the product, before the product is used as the high-purity flux component.

Gallium and nitrogen are caused to react with each other, for example, under reaction conditions where the temperature is 100 to 1500° C. and the pressure is 100 Pa to 20 MPa; preferably, the temperature is 300 to 1200° C., and the pressure is 0.01 MPa to 10 MPa and, more preferably, the temperature is 500 to 1100° C. and the pressure is 0.1 MPa to 6 MPa. The reaction preferably is carried out in a nitrogen-containing gas atmosphere. This is because the nitrogen-containing gas dissolves in the flux to provide a material for the growth of a GaN crystal. Examples of the nitrogen-containing gas include nitrogen ($N_2$) gas, ammonia ($NH_3$) gas and the like, which may be mixed (the mixture ratio is not limited). In particular, when ammonia gas is used, the reaction pressure preferably can be reduced.

In the production method of the present invention, the seed crystal is likely to dissolve in the flux before the concentration of nitrogen increases. To prevent this, nitride preferably is provided in the flux at least during an initial period of the reaction. Examples of the nitride include $Ca_3N_2$, $Li_3N$, $NaN_3$, BN, $Si_3N_4$, InN and the like, which may be used singly or in a combination of two or more thereof. The proportion of the nitride to the flux is, for example, 0.0001 mol % to 99 mol %, preferably 0.001 mol % to 50 mol %, and more preferably 0.005 mol % to 10 mol %.

In the production method of the present invention, an impurity can be provided in the mixture flux. In this case, an impurity-containing GaN crystal can be produced. Examples of the impurity include silicon (Si), alumina ($Al_2O_3$), indium (In), aluminum (Al), indium nitride (InN), silicon oxide ($SiO_2$), indium oxide ($In_2O_3$), zinc (Zn), magnesium (Mg), zinc oxide (ZnO), magnesium oxide (MgO), germanium (Ge) and the like.

As described above, the carbon content of the melt is adjusted. For example, in order to adjust the carbon content to a predetermined amount, at least one of the step of removing a portion of carbon in the melt and the step of adding carbon into the melt is performed. The carbon may be carbon or a carbon compound. The carbon is preferably carbon or a carbon compound that generates a cyanide ion (CN) in the melt. The carbon also may be a gaseous organic substance. Examples of such carbon and a carbon compound include a cyanide, graphite, diamond, fullerene, carbon nanotube, methane, ethane, propane, butane, benzene and the like. The carbon content is not particularly limited. When one of the step of adding carbon into the melt and the step of removing a portion of carbon in the melt is performed so as to prevent nucleation from occurring in the melt, the carbon content with reference to the total of the melt, the gallium and the carbon is within the range of, for example, 0.01 to 20 atoms (at.) %, 0.05 to 15 atoms (at.) %, 0.1 to 10 atoms (at.) %, 0.1 to 5 atoms (at.) %, 0.25 to 7.5 atoms (at.) %, 0.25 to 5 atoms (at.) %, 0.5 to 5 atoms (at.) %, 0.5 to 2.5 atoms (at.) %, 0.5 to 2 atoms (at.) %, 0.5 to 1 atom (at.) %, 1 to 5 atoms (at.) %, or 1 to 2 atoms (at.) %. Among them, the range of 0.5 to 5 atoms (at.) %, the range of 0.5 to 2.5 atoms (at.) %, the range of 0.5 to 2 atoms (at.) %, the range of 0.5 to 1 atom (at.) %, the range of 1 to 5 atoms (at.) %, or the range of 1 to 2 atoms (at.) % is preferable. When one of the step of adding carbon into the melt and the step of removing a portion of carbon in the melt is performed so as to grow a non-polar surface of a GaN crystal, the carbon content with reference to the total of the melt, the gallium and the carbon is within the range of, for example, 0.01 to 25 atoms (at.) %, 0.05 to 20 atoms (at.) %, 0.5 to 15 atoms (at.) %, 0.3 to 8 atoms (at.) %, 0.75 to 10 atoms (at.) %, 1.0 to 5 atoms (at.) %, or 2.0 to 5 atoms (at.) %. Among them, the range of 1.0 to 5 atoms (at.) % or the range of 2.0 to 5 atoms (at.) % is preferable. Note that the "melt" in the total of the melt, the gallium and the carbon refers to the total of the components contained in the melt. For example, when the melt is a flux of only Na, the melt refers to only Na. When the melt is a mixed flux of Na and Ca, the melt refers to the total of Na and Ca.

Figure 2:
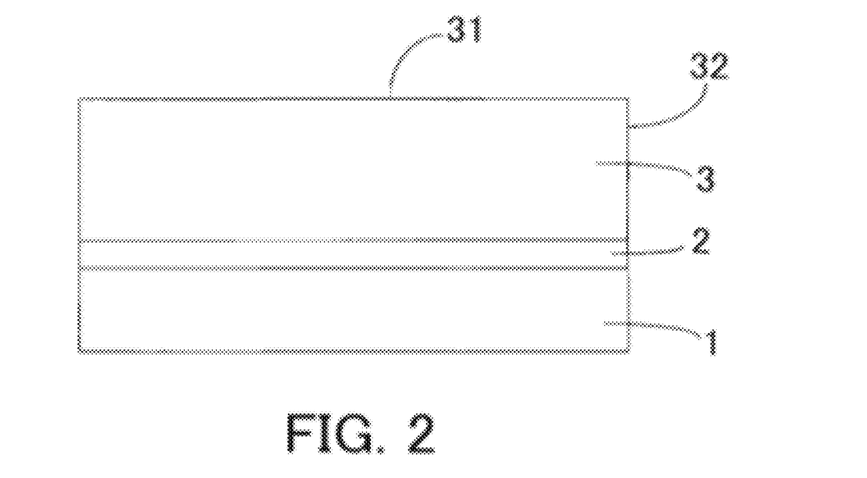
FIG. 2 is a diagram showing the structure of an exemplary GaN crystal formed on a substrate.
Figure 3:
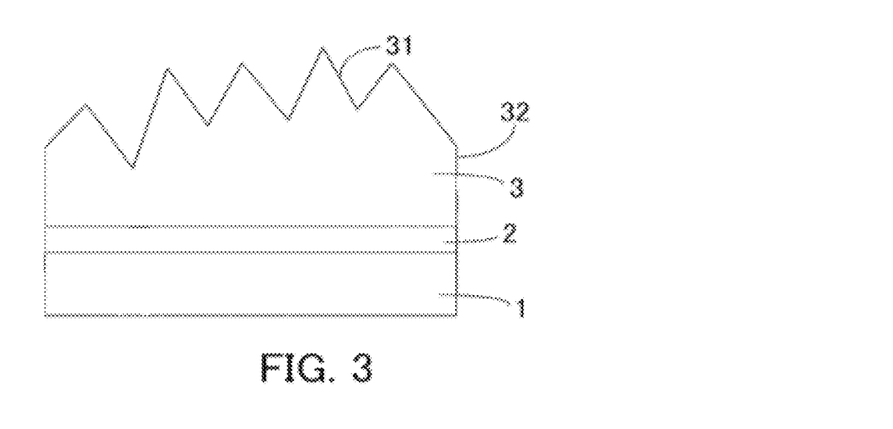
FIG. 3 is a diagram showing a structure of an exemplary GaN crystal formed on a substrate according to the present invention.

As described above, the seed crystal is preferably a GaN layer formed on a substrate. The substrate can be a sapphire substrate, a silicon carbide (SiC) substrate or the like. The GaN layer may be, for example, either crystalline or amorphous. The crystalline GaN layer may be either a single crystal or polycrystalline. The GaN layer is preferably, but not particularly limited to being, in the form of, for example, a thin film layer. The thin film layer has, but is not particularly limited to having, a thickness within the range of, for example, 0.0005 to 100000 µm, 0.001 to 50000 µm, 0.01 to 5000 µm, 0.01 to 500 µm, 0.01 to 50 µm, 0.1 to 50 µm, 0.1 to 10 µm, 0.1 to 5 µm, 1 to 10 µm, or 1 to 5 µm. A front surface (upper surface) of the GaN crystal layer is preferably a non-polar surface that is either an M-plane or an a-plane. When the front surface (upper surface) of the GaN crystal layer on the substrate is a non-polar surface, a GaN crystal 3 having a smooth non-polar surface 31 can be grown on the front surface of the GaN crystal layer 2 on the substrate 1 by adding carbon into the melt as shown in FIG. 2. In this case, a side surface 32 of the GaN crystal 3 is a c-plane. By contrast, when the front surface (upper surface) of the GaN crystal layer on the substrate is a c-plane, then if carbon is added to the melt, the upper surface (front surface) 31 of the GaN crystal 3 formed on the GaN crystal layer 2 has a cross-section in the shape of a broken line as shown in FIG. 3. This is because if the front surface of the GaN crystal layer 2 is a c-plane, the GaN crystal 3 on the GaN crystal layer 2 is grown on both its a-plane and M-plane. Note that, in FIG. 3, the side surface 32 of the GaN crystal 3 is a c-plane. Even when a GaN crystal has a front surface (upper surface) having a broken line-shaped cross-section, the GaN crystal can be put into practical use if the front surface is polished so as to be smooth. The thin film layer can be formed on the substrate by, for example, Metal-Organic Vapor Phase Deposition (MOCVD), Halide Vapor Phase Epitaxy (HYPE), Molecular Beam Epitaxy (MBE) or the like. The thin film layer has a maximum diameter of, for example, 2 cm or more, preferably 3 cm or more, and more preferably 5 cm or more. The larger the diameter, the better the thin film layer. The upper limit of the diameter is not limited. The standard size of a bulk compound semiconductor is two inches. In view of this, the maximum diameter is preferably 5 cm. In this case, the maximum diameter is within the range of, for example, 2 to 5 cm, preferably 3 to 5 cm, and more preferably 5 cm. Note that the maximum diameter refers to the length of the longest of lines each of which connects one point to another on an outer circumference of a surface of the thin film layer.

Note that, in the production method of the present invention, it is not essential to place previously, as a crystal nucleus, a seed crystal of GaN in the melt containing an alkali metal. If the carbon content of the melt is only adjusted to a predetermined amount, the effect of the present invention can be obtained without previously providing a GaN seed crystal as a crystal nucleus (i.e., at least one of the prevention of nucleation in the melt and the growth of a high-quality non-polar surface can be achieved).

Note that a GaN crystal can be grown more easily when a seed crystal containing GaN is provided in the melt than when a seed crystal is not provided.

Figure 13:
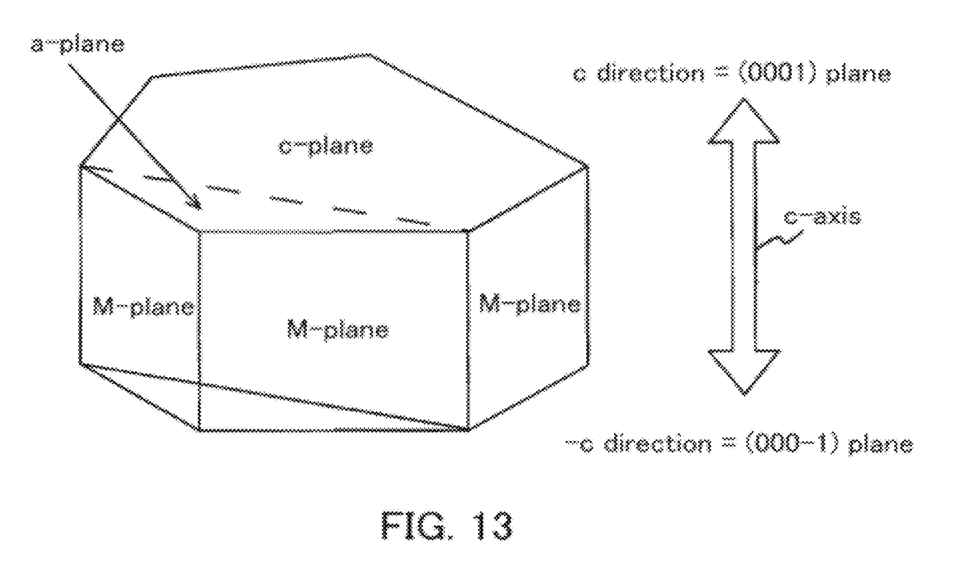
FIG. 13 is a schematic diagram showing an exemplary structure of a GaN crystal.

Here, the structure of a GaN crystal will be described with reference to a schematic diagram shown in FIG. 13. As shown in FIG. 13, in the GaN crystal, M- and a-planes are parallel to a c-axis, and in other words, are perpendicular to a c-plane. An a-plane is present in the direction of an intermediate angle of an angle formed by two adjacent M-planes. This relationship between the M- and a-planes is satisfied the other way around.

The GaN crystal produced by the GaN crystal producing method of the present invention is, for example, either a single crystal or polycrystalline, and is preferably a single crystal.

Figure 11:
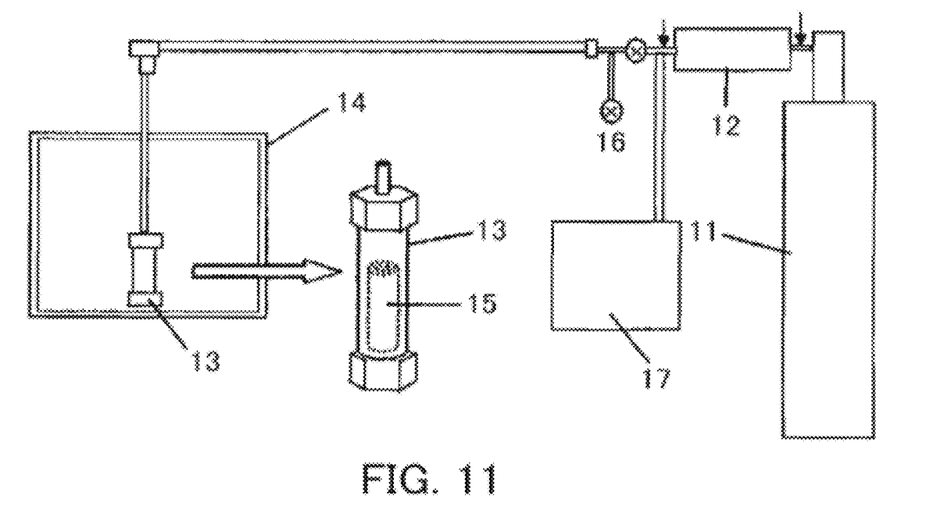
FIG. 11 is a diagram showing the structure of an exemplary production apparatus, which is used in a GaN crystal producing method according to the present invention.

As described above, the GaN crystal producing apparatus of the present invention produces a GaN crystal in a melt containing at least an alkali metal and gallium. The apparatus includes an adjustment unit for adjusting a carbon content of the melt, and a reaction unit for causing the gallium and nitrogen to react with each other. The production method of the present invention may be performed using any production apparatus, and preferably the GaN crystal producing apparatus of the present invention, for example. FIG. 11 shows an example of the GaN crystal producing apparatus of the present invention. The GaN crystal producing apparatus of the present invention includes an adjustment unit for adjusting a carbon content of a melt, and a reaction unit for causing gallium and nitrogen to react with each other. As shown in FIG. 11, this apparatus includes a gas tank 11, a pressure adjuster 12, an electric furnace 14, a heat- and pressure-resistant container 13, and a vacuum pump 17. The electric furnace 14 is, for example, a resistance heater. The electric furnace 14 may be made of a heat insulator. If the resistance heater is used at 1000° C. or less, a Kanthal wire can be used as its heating element; therefore, the apparatus can have a simple configuration. If the resistance heater is heated up to 1500° C., $MoSi_2$ or the like is used. The gas tank 11 holds a nitrogen-containing gas, such as nitrogen gas, ammonia gas or the like. The gas tank 11 and the vacuum pump 17 are linked via pipes to the heat- and pressure-resistant container 13 with the pressure adjuster 12 being provided therebetween. The pressure adjuster 12 can adjust the nitrogen-containing gas to a gas pressure of, for example, 1 to 100 atm, and supply the resultant gas to the heat- and pressure-resistant container 13. Alternatively, the gas pressure can be reduced by the vacuum pump 17. Note that, in FIG. 11, reference numeral 16 indicates a relief valve. The heat- and pressure-resistant container 13 is, for example, a stainless steel container. The heat- and pressure-resistant container 13 is placed and heated in the electric furnace 14. A crucible 15 is provided in the heat- and pressure-resistant container 13. The crucible 15 is made of alumina ($Al_2O_3$), tungsten (W), platinum (Pt), SUS or the like. Note that a crucible made of a carbon-based material, such as a graphite crucible, a silicon carbide crucible or the like, may be used. Note that even if a crucible made of a carbon-based material is used, the amount of carbon that leaks from the crucible is considerably small and, therefore, the effect of the present invention cannot be obtained unless extra carbon is added. Gallium (Ga) as a material for the crystal, and an alkali metal (Na, etc.) as a material for the melt, and carbon (e.g., graphite) are placed in the crucible 15. Note that, in the present invention, other components may be placed in the crucible. For example, an impurity for doping may be added. An example of a P-type doping material is Mg, and an example of an N-type doping material is Si. The shape of the crucible is not particularly limited. For example, the crucible is, but is not limited to being, in the shape of a cylinder (circular cross-section). The crucible may be in the shape of a cylinder having a non-circular cross-section. The efficiency of agitating a melt by shaking the crucible is higher when a crucible having a non-circular cross-section is used than when a crucible having a circular cross-section is used.

This apparatus can be used to produce a single GaN crystal as follows. Initially, a sapphire substrate on which a thin GaN crystal film layer is formed is placed in the crucible. On the other hand, gallium (Ga), metal sodium (Na) and carbon (C) are weighed in a glove box, and then are placed in the crucible 15, which in turn is set in the heat- and pressure-resistant container 13. Thereafter, nitrogen gas is supplied from the gas tank 11 to the heat- and pressure-resistant container 13. In this case, the nitrogen gas is adjusted to a predetermined pressure by the adjuster 12. Thereafter, the inside of the heat- and pressure-resistant container 13 is heated by the electric furnace 14. As a result, sodium is melted to form a melt in the crucible 15. The nitrogen gas is dissolved into the melt, so that the nitrogen reacts with gallium in the presence of carbon. Thereafter, a GaN crystal grows on a thin GaN film layer on the substrate. During this crystal growth, since carbon is present in the melt, a GaN crystal nucleus is prevented from forming in the melt, and a GaN crystal growing on the thin GaN film layer on the substrate grows a non-polar surface (an a-plane or an M-plane). For example, the crucible 15 corresponds to an "adjustment unit for adjusting a carbon content of a melt" of the present invention. For example, the crucible 15 also corresponds to a "reaction unit for causing gallium and nitrogen to react with each other" of the present invention. The growth mechanism of the GaN crystal of the present invention may be, for example, that carbon in the melt reacts with nitrogen to provide $CN^-$ in the vicinity of the gas-liquid interface of the flux, which suppresses the degree of nitrogen supersaturation, so that the formation of polycrystalline material can be prevented in the vicinity of the gas-liquid interface. Therefore, the production method of the present invention can be used to produce a crystal of a nitride of a group III element other than gallium if it is performed in the presence of nitrogen and carbon. When the group III nitride crystal is produced, the gallium may be replaced with or used in combination with another group III element (Al, In, etc.). An example of such a group III nitride crystal is $Al_sGa_tIn_{(1-s-t)}N$ (note that $0 \leq s \leq 1$, $0 \leq t \leq 1$, $s+t \leq 1$). Note that the present invention is not limited to that inferred above.

The production method of the present invention further may include an agitation step of agitating the melt as described above. For example, if gallium and nitrogen are caused to react with each other in the melt while the melt and the gallium are being agitated and mixed, the rate of dissolution of the nitrogen into the mixed solution can be increased and gallium and nitrogen are distributed uniformly in the melt. In addition, a fresh material invariably can be supplied to a growth surface of a crystal. As a result, it is possible to, more preferably, quickly produce a bulk transparent gallium nitride crystal, which has a low dislocation density, a uniform thickness, and high quality. Also, in this case, a GaN crystal having a smooth surface can be obtained.

In the present invention, the agitation step is not particularly limited. The agitation step may be carried out with reference to, for example, Japanese Patent Application No. 2005-503673 (International Publication WO2004/083498), whose inventors include some of the inventors of the present application, or using any other methods. Specifically, the agitation step of the present invention can be carried out by, for example, shaking and/or rotating the heat- and pressure-resistant container. Alternatively, the melt can be agitated by creating a change in temperature of the melt in the crucible. This is because thermal convection occurs in the melt. More specifically, for example, heating the heat- and pressure-resistant container forms a melt, and also generates thermal convection, so that the melt and the gallium can be agitated and mixed. Moreover, the agitation step may be carried out using a stirring blade. These agitating/mixing means can be used in combination.

In the present invention, the shaking of the heat- and pressure-resistant container is not particularly limited. For example, the heat- and pressure-resistant container may be inclined in one direction and then in the opposite direction, i.e., the heat- and pressure-resistant container may be shaken in a predetermined direction. The heat- and pressure-resistant container may be shaken either regularly or irregularly (intermittently). The shaking may be combined with rotation. The slope of the heat- and pressure-resistant container during shaking is not particularly limited. In the case of regular shaking, its cycle is, for example, one second to 10 hours, preferably 30 seconds to one hour, and more preferably one minute to 20 minutes. The heat- and pressure-resistant container during shaking has a maximum slope of, for example, five degrees to 70 degrees, preferably 10 degrees to 50 degrees, and more preferably 15 degrees to 45 degrees, with respect to a central line in a height direction of the heat- and pressure-resistant container. Also, as described below, when the substrate is placed at a bottom of the heat- and pressure-resistant container, a gallium nitride thin film on the substrate may be invariably covered with the melt during the shaking, or the melt may be removed from the substrate when the heat- and pressure-resistant container is inclined.

The heating of the heat- and pressure-resistant container for thermal convection is not particularly limited as long as thermal convection occurs. The portion of the heat- and pressure-resistant container that is heated is not particularly limited. For example, the heat- and pressure-resistant container may be heated at a bottom portion thereof or at a side wall of a lower portion thereof. A heating temperature of the heat- and pressure-resistant container for thermal convection is, for example, higher than a heating temperature for formation of the melt by 0.01° C. to 500° C., preferably 0.1° C. to 300° C., and more preferably 1° C. to 100° C. The heating can be carried out using a commonly used heater.

The agitation step using a stirring blade is not particularly limited. For example, the stirring blade may be rotated and/or moved back and forth. Also, in the agitation step using a stirring blade, the heat- and pressure-resistant container may be rotated and/or moved back and forth with respect to the stirring blade. Also, in the agitation step using a stirring blade, the movement of the stirring blade itself and the movement of the heat- and pressure-resistant container itself may be combined. The stirring blade is not particularly limited. The shape and material of the stirring blade can be determined appropriately, depending on, for example, a size, a shape or the like of the heat- and pressure-resistant container. The stirring blade preferably is made of a non-nitrogen-containing material having a melting point or a decomposition temperature of 2000° C. or more. This is because a stirring blade made of such a material is not melted in the melt, and crystal nucleation can be prevented on the surface of the stirring blade.

Also, examples of a material for the stirring blade include rare-earth oxides, alkaline-earth metal oxides, W, SiC, diamond, diamond-like carbon and the like. A stirring blade made of such a material does not dissolve in the melt as described above, and can prevent crystal nucleation on the surface of the stirring blade. Examples of the rare earth and the alkaline-earth metal include Sc, Y, La, Ce, Pr, Nd, Pm, Sm, Eu, Gd, Tb, Dy, Ho, Er, Tm, Yb, Be, Mg, Ca, Sr, Ba, and Ra. The stirring blade is preferably made of $Y_2O_3$, CaO, MgO, W, SiC, diamond, diamond-like carbon or the like. $Y_2O_3$ is the most preferable of them.

Next, the full width at half maximum of a rocking curve of the double-crystal X-ray diffraction of the GaN crystal of the present invention is within the range of more than zero seconds and 200 seconds or less. The lower value thereof is more preferable. The full width at half maximum of a double-crystal X-ray diffraction rocking curve can be measured by using a first crystal to cause an X-ray from an X-ray source to be highly monochromatic, irradiating the GaN crystal as a second crystal with the X-ray, and obtaining a Full Width at Half Maximum (FWHM) around a peak of the X-ray diffracted by the GaN crystal. Note that the X-ray source is not particularly limited. For example, a CuKα ray can be used as the X-ray source. Examples of the first crystal include, but are not particularly limited to, an InP crystal, a Ge crystal and the like.

The GaN crystal of the present invention has a dislocation density within the range of more than $0/cm^2$ and $10^6/cm^2$ or less. The lower dislocation density is more preferable. Examples of the type of dislocation of the dislocation density include, but are not particularly limited to, edge dislocation and screw dislocation. Examples of the method of measuring the dislocation density include, but are not particularly limited to, measurement by observing a crystal structure of a group III nitride crystal using a transmission electron microscope (TEM).

The GaN crystal of the present invention may contain carbon. The carbon may be, for example, derived from carbon in the melt. Carbon contained in the group III nitride crystal may be in the form of any of an atom, a molecule, or a compound with another element. The carbon content of the group III nitride crystal is not particularly limited and is, for example, within the range of $10^{15}$ to $10^{22}/cm^3$, preferably $10^{16}$ to $10^{21}/cm^3$, and more preferably $10^{17}$ to $10^{20}/cm^3$. A GaN crystal obtained by the production method of the present invention contains carbon derived from the melt. Therefore, if carbon is detected in a GaN crystal, the GaN crystal is determined to have been produced by the production method of the present invention. The method of producing the GaN crystal of the present invention is not particularly limited. Therefore, a GaN crystal produced by a method other than the production method of the present invention may not contain carbon. A method of detecting carbon from a GaN crystal is not particularly limited, and is, for example, secondary ion mass spectrometry. Note that the proportion of carbon in the GaN crystal of the present invention is similar to that which has been described above. When the GaN crystal of the present invention contains carbon, the GaN crystal may be a P-type semiconductor.

The substrate of the present invention includes the GaN crystal of the present invention. The substrate of the present invention may be provided by using the production method of the present invention to form a GaN crystal on a thin GaN crystal film on a substrate made of, for example, sapphire. In this case, preferably, by peeling off the substrate made of sapphire or the like, a self-supporting substrate made only of the GaN crystal is provided. As shown in FIG. 1, if a semiconductor device, such as an LED or the like, is provided on the substrate 1 of the present invention, the semiconductor device can exhibit high performance. For example, an LED having a high luminance can be obtained. Examples of the type of semiconductor device of the present invention include, but are not particularly limited to, an LED, a semiconductor laser, and a high-frequency power electronic device.

EXAMPLES

Next, examples of the present invention will be described. Note that the present invention is not limited to the examples described below.

Example 1

A GaN crystal was produced using the apparatus of FIG. 11. Specifically, a sapphire substrate on which a thin GaN film layer (its upper surface being a c-plane) was provided was initially placed in an alumina crucible 15. Sodium (Na), gallium (Ga) and carbon (C: graphite) also were placed in the alumina crucible 15. The molar ratio of sodium (Na) to gallium (Ga) was Na:Ga=73:27. The proportion of added carbon (C) to the total (Na+Ga+C) of sodium (Na), gallium (Ga) and carbon (C) was 0, 0.02, 0.1, 0.5, 1, 2, and 5 atoms % (at. %). Note that the case where the carbon proportion was 0 at. % is Comparative Example 1. The crucible 15 was placed in a stainless steel container 13. The stainless steel container 13 was placed in a heat- and pressure-resistant container 14. While nitrogen gas was introduced from the gas tank 11 to the stainless steel container 13, the heat- and pressure-resistant container 14 was heated using a heater (not shown) so that the inside thereof was at a high temperature of 850° C. and a high pressure of 40 atm (about 4.0 MPa). The components were allowed to react with each other for 96 hours. Thus, an intended GaN crystal was produced.

Figure 4:
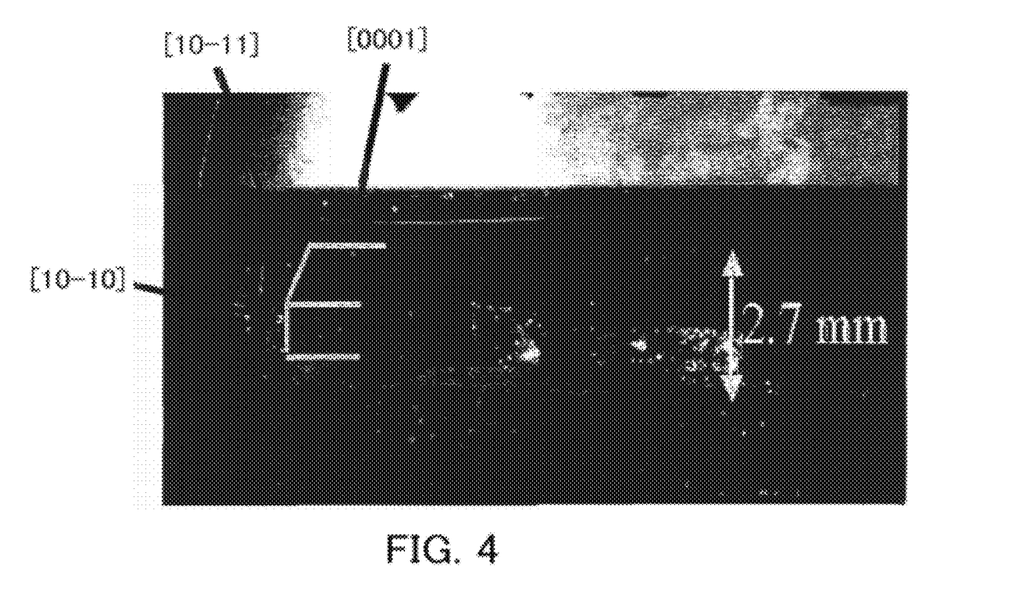
FIG. 4 is a photograph of a GaN crystal in Example 1 of the present invention.
Figure 5:
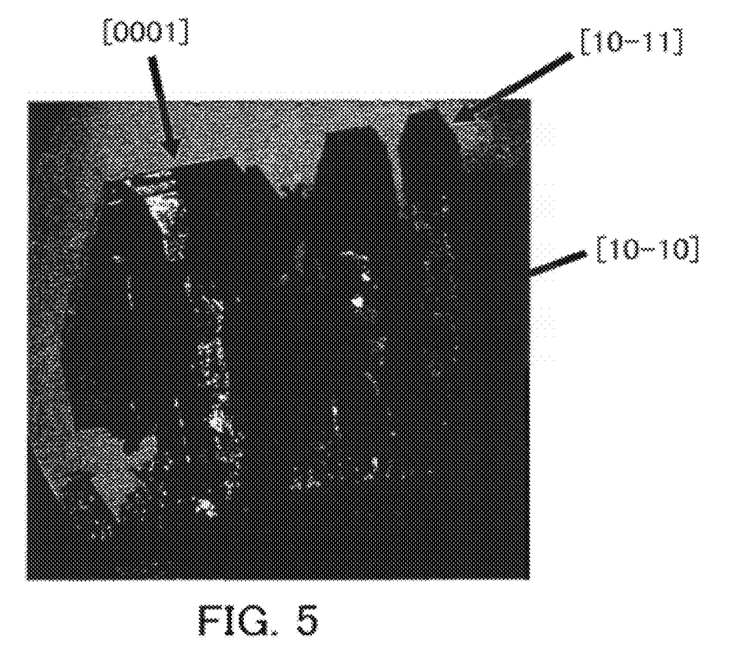
FIG. 5 is another photograph of the GaN crystal in Example 1.
Figure 6:
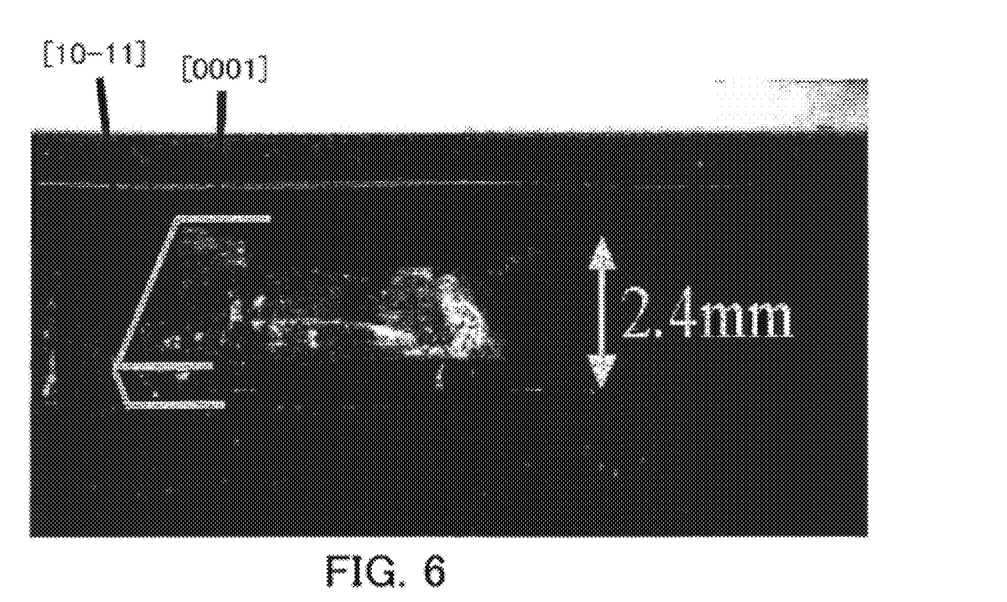
FIG. 6 is a photograph of a GaN crystal in Comparative Example 1.

FIG. 4 shows a photograph of the GaN crystal when the proportion of added carbon was 1 at. %. FIG. 5 shows a photograph of the GaN crystal when the proportion of added carbon was 5 at. %. FIG. 6 shows a photograph of the GaN crystal when the proportion of added carbon was 0 at. %

Comparative Example 1

Figure 7:
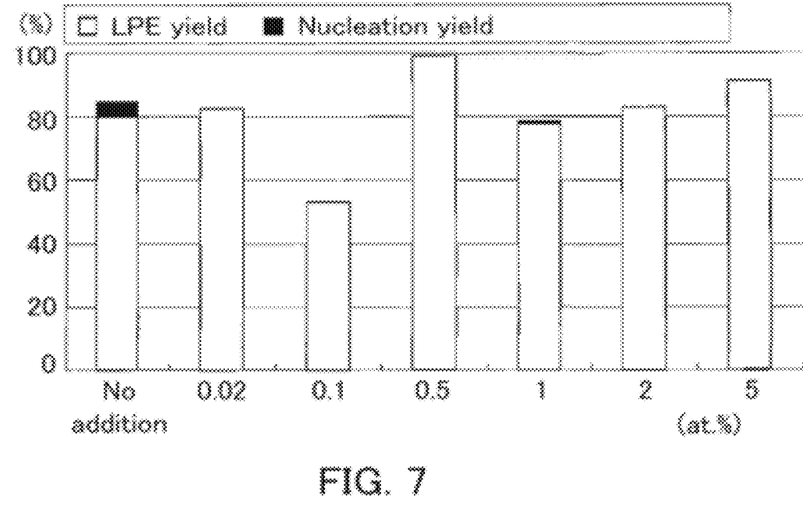
FIG. 7 is a graph showing the relationship between the proportion of added carbon and the yield of a crystal in Example 1 and Comparative Example 1.

As shown in FIG. 6, in the GaN crystal in which carbon was not added, [0001] (c-plane) and [10-11] planes grew. By contrast, as shown in FIG. 4, in the GaN crystal in which carbon was added at a proportion of 1 at. %, a [10-10] plane (M-plane) grew. Also, as shown in FIG. 5, in the GaN crystal in which carbon was added at a proportion of 5 at. %, a [10-10] plane (M-plane) grew significantly. FIG. 7 shows a graph indicating the yields of GaN crystals corresponding to the respective proportions of added carbon. In FIG. 7, open bars indicate the yields of GaN crystals that grew on the thin GaN crystal film layers (LPE yields), and closed bars indicate the yields of GaN crystals that grew in the melt after nucleation (nucleation yield). As shown in the graph of FIG. 7, although nucleation occurred when carbon was not added, nucleation was prevented when carbon was added. An increase in the amount of added carbon did not decrease the LPE yield.

Example 2

Figure 9:
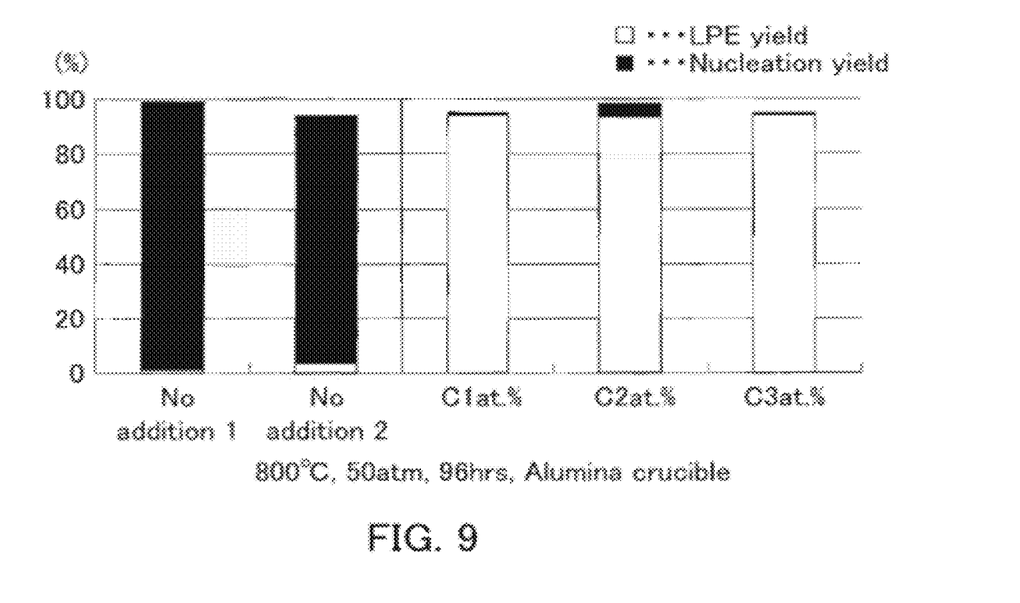
FIG. 9 is a graph showing the relationship between the proportion of added carbon and the yield of a crystal in Example 2 and Comparative Examples 2 and 3.

GaN crystals were produced in the same manner as that of Example 1, except that the reaction conditions for crystal growth were a temperature of 800° C. and a pressure of 50 atm (about 5.0 MPa), and the proportions of added carbon were 0 at. % (Comparative Examples 2 and 3), 1 at. %, 2 at. %, and 3 at. %. The results are shown in the graph of FIG. 9. In FIG. 9, open bars indicate the yields of GaN crystals that grew on the thin GaN crystal film layers (LPE yields), and closed bars indicate the yields of GaN crystals that grew in the melt after nucleation (nucleation yields). In FIG. 9, "no addition 1" corresponds to Comparative Example 2, and "no addition 2" corresponds to Comparative Example 3. As shown in the graph of FIG. 9, when carbon was not added, nucleation occurred, which blocked growth of a GaN crystal on the thin GaN crystal film layer. When carbon was added, nucleation was prevented, so that a GaN crystal having a high-quality non-polar surface grew on the thin GaN crystal film layer.

Example 3

Figure 10:
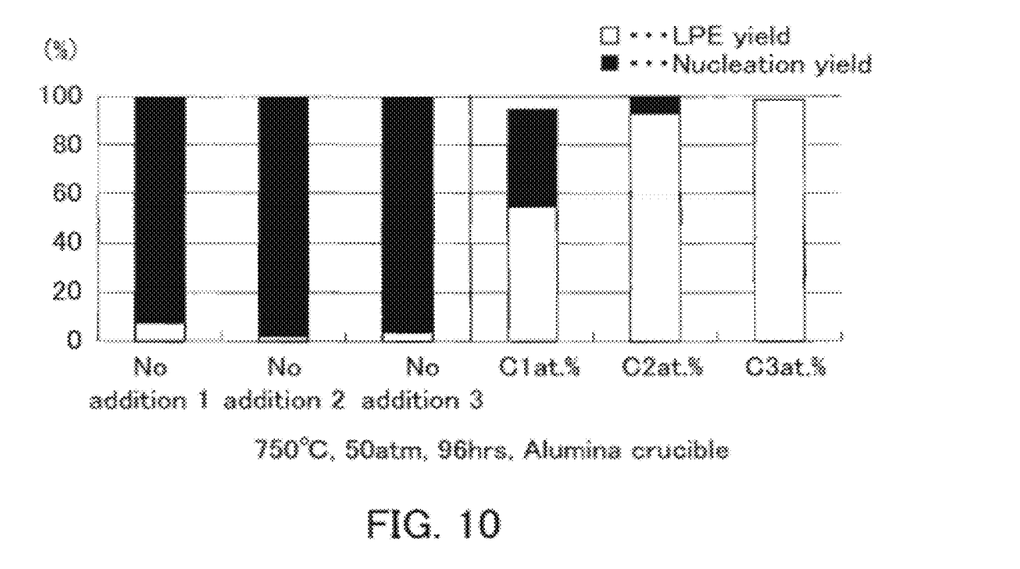
FIG. 10 is a graph showing the relationship between the proportion of added carbon and the yield of a crystal in Example 3 and Comparative Examples 4 to 6.

GaN crystals were produced in the same manner as that of Example 1, except that the reaction conditions for crystal growth were a temperature of 750° C. and a pressure of 50 atm (about 5.0 MPa), and the proportions of added carbon were 0 at. % (Comparative Examples 4, 5 and 6), 1 at. %, 2 at. %, and 3 at. %. The results are shown in the graph of FIG. 10. In FIG. 10, open bars indicate the yields of GaN crystals that grew on the thin GaN crystal film layers (LPE yields), and closed bars indicate the yields of GaN crystals that grew in the melt after nucleation (nucleation yields). In FIG. 10, "no addition 1" corresponds to Comparative Example 4, "no addition 2" corresponds to Comparative Example 5, and "no addition 3" corresponds to Comparative Example 6. As shown in the graph of FIG. 10, when carbon was not added, nucleation occurred, which blocked growth of a GaN crystal on the thin GaN crystal film layer. When carbon was added, nucleation was prevented, so that a GaN crystal having a high-quality non-polar surface grew on the thin GaN crystal film layer.

Example 4

Figure 12:
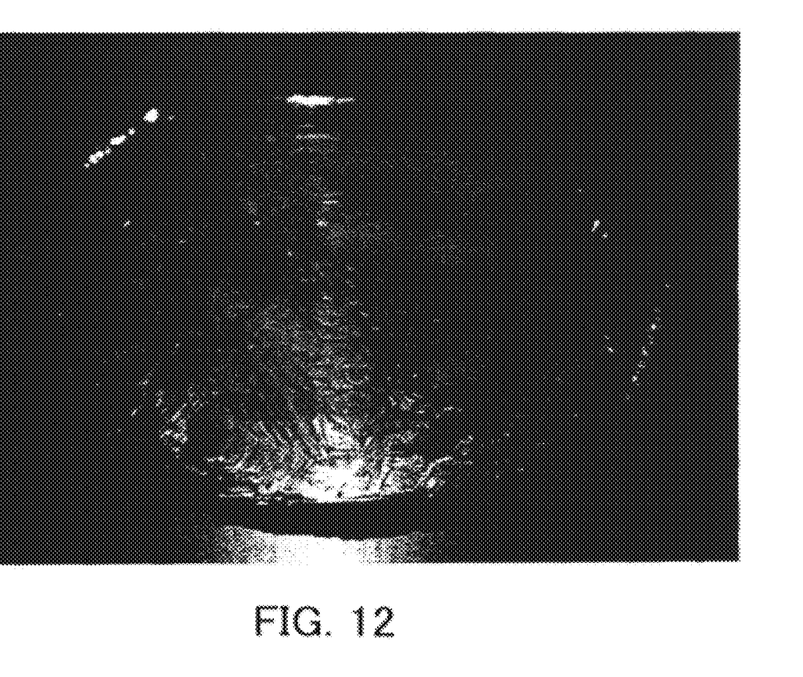
FIG. 12 is a photograph of a single GaN crystal in Example 4 of the present invention.

In this example, a 2-inch, thin GaN film (a thin GaN film having a diameter of 5 cm and an M-plane as its upper surface) grown on a sapphire substrate by MOCVD was used as a seed crystal, and carbon was added during the growth of a bulk single GaN crystal, and the effect was confirmed. This experiment was conducted in accordance with a procedure specifically described as follows. Initially, 15 g of Ga and 14.8 g of Na were placed along with the seed substrate in an alumina crucible. Thereafter, graphite as a carbon source was added in a proportion of 0.5 mol % to Na. Thereafter, epitaxial growth was performed for 96 hours at a growth temperature of 860° C. and a growth pressure of 45 atm. As a result, a single GaN crystal having a thickness of about 2 mm (diameter: about 5 cm) epitaxially grew on the seed crystal substrate. FIG. 12 shows a photograph of this single GaN crystal. The GaN crystal of this example is the world's largest single GaN crystal that has ever been reported. In this example, the ratio of a GaN crystal (a) that grew on the crucible to a GaN crystal (b) that epitaxially grew on the seed crystal was (a:b)=2:8. On the other hand, when single GaN crystals were grown under the same conditions, except that carbon was not added, the ratio (a:b) was 95:5. Therefore, in the present invention, the addition of carbon suppresses the occurrence of nucleation on a crucible, so that epitaxial growth is promoted. The results demonstrate that a large-size crystal can be grown.

INDUSTRIAL APPLICABILITY

As described above, according to the GaN crystal producing method of the present invention, at least one of the prevention of nucleation and the growth of a high-quality non-polar surface can be achieved. If the GaN crystal of the present invention is, for example, used as a substrate, a high-performance semiconductor device can be fabricated. Therefore, the present invention is useful in the field of group III nitride crystal semiconductors, such as heterojunction high-speed electronic and photoelectronic devices (a semiconductor laser, a light emitting diode, a sensor, etc.) and the like.

The invention claimed is:

1. A method for producing a GaN crystal in a melt containing at least an alkali metal and gallium, comprising:
    a preparation step of preparing the melt by adding the alkali metal, the gallium, and carbon to a crucible and then heating the crucible;
    an adjustment step of adjusting a carbon content of the melt; and
    a reaction step of causing the gallium and nitrogen to react with each other,
    wherein forming a crystal nucleus other than a seed crystal is prevented by adjusting the carbon content of the melt, and
    the carbon content is adjusted to be in a range of 0.1 to 5 atom % relative to a total of the melt, the gallium, and the carbon.

2. The GaN crystal producing method according to claim 1, wherein the adjustment step includes at least one of a removal step of removing a portion of carbon in the melt and an addition step of adding carbon into the melt.

3. The GaN crystal producing method according to claim 1, comprising: a seed crystal providing step of providing a seed crystal in the melt, wherein the seed crystal is a GaN crystal.

4. The GaN crystal producing method according to claim 1, wherein the carbon is at least one of carbon and a carbon compound.

5. The GaN crystal producing method according to claim 3, wherein the seed crystal is a GaN crystal layer provided on a substrate.

6. The GaN crystal producing method according to claim 1, wherein a non-polar surface of the GaN crystal is grown by adjusting the carbon content of the melt.

7. The GaN crystal producing method according to claim 1, wherein the melt contains Na.

8. The GaN crystal producing method according to claim 7, wherein a non-polar surface of the GaN crystal is grown by adjusting the carbon content of the melt, the non-polar surface being at least one of an M-plane and an a-plane.

9. The GaN crystal producing method according to claim 8, wherein an upper surface of the GaN crystal layer on the substrate is a non-polar surface.

10. The GaN crystal producing method according to claim 1, further comprising: an agitation step of agitating the melt.

11. A GaN crystal,
    wherein the GaN crystal has a non-polar surface as a major surface thereof,
    a full width at half maximum of a rocking curve of double-crystal X-ray diffraction within a range of more than 0 seconds to 200 seconds or less, and
    a dislocation density within a range of more than $0/cm^2$ and $10^6/cm^2$ or less,
    wherein the GaN crystal is produced by method comprising:
    a preparation step of preparing a melt by adding an alkali metal, gallium, and carbon to a crucible and then heating the crucible;
    an adjustment step of adjusting a carbon content of the melt; and
    a reaction step of causing the gallium and nitrogen to react with each other, and
    wherein forming a crystal nucleus other than a seed crystal is prevented by adjusting the carbon content of the melt, and
    the carbon content is adjusted to be in a range of 0.1 to 5 atom % relative to a total of the melt, the gallium, and the carbon.

12. A method for producing a GaN crystal in a melt containing at least an alkali metal and gallium, comprising:
    a preparation step of preparing the melt by adding the alkali metal, the gallium, and carbon to a crucible and then heating the crucible;
    an adjustment step of adjusting a carbon content of the melt; and
    a reaction step of causing the gallium and nitrogen to react with each other,
    wherein a non-polar surface of the GaN crystal is grown by adjusting the carbon content of the melt, and
    the carbon content is adjusted to be in a range of 0.3 to 8 atom % relative to a total of the melt, the gallium, and the carbon.

* * * * *